US009666408B2

(12) United States Patent
Nakagawa et al.

(10) Patent No.: US 9,666,408 B2
(45) Date of Patent: May 30, 2017

(54) APPARATUS AND METHOD FOR PROCESSING SAMPLE, AND CHARGED PARTICLE RADIATION APPARATUS

(71) Applicant: Hitachi High-Technologies Corporation, Minato-ku, Tokyo (JP)

(72) Inventors: Shuichi Nakagawa, Tokyo (JP); Masaru Matsushima, Tokyo (JP); Masakazu Takahashi, Tokyo (JP); Seiichiro Kanno, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 14/760,268

(22) PCT Filed: Jan. 20, 2014

(86) PCT No.: PCT/JP2014/051003
§ 371 (c)(1),
(2) Date: Jul. 10, 2015

(87) PCT Pub. No.: WO2014/112628
PCT Pub. Date: Jul. 24, 2014

(65) Prior Publication Data
US 2015/0340198 A1 Nov. 26, 2015

(30) Foreign Application Priority Data

Jan. 21, 2013 (JP) .................................. 2013-008318

(51) Int. Cl.
*H01J 37/18* (2006.01)
*H01J 37/20* (2006.01)
(Continued)

(52) U.S. Cl.
CPC ............ *H01J 37/185* (2013.01); *H01J 37/20* (2013.01); *H01L 21/67248* (2013.01);
(Continued)

(58) Field of Classification Search
CPC ..................................................... H01J 21/306
(Continued)

(56) References Cited

U.S. PATENT DOCUMENTS 5,914,493 A 6/1999 Morita et al.
6,471,037 B1 10/2002 Matsumoto
(Continued)

FOREIGN PATENT DOCUMENTS

JP 8-264618 A 10/1996
JP 9-166428 A 6/1997
(Continued)

OTHER PUBLICATIONS

International Search Report (PCT/ISA/210) dated Apr. 15, 2014, with English translation (four (4) pages).

*Primary Examiner* — Phillip A Johnston
(74) *Attorney, Agent, or Firm* — Crowell & Moring LLP

(57) ABSTRACT

In order to prevent a sample from thermally expanding and contracting when the sample is placed on a sample stage inside a vacuum chamber, the related art has proposed a coping method of awaiting observation by setting a standby time from when the wafer is conveyed into the vacuum chamber until the wafer and the sample table are brought into thermal equilibrium. In addition, the coping method is configured so as to await the observation until the wafer is cooled down to room temperature when the wafer is heated in the previous step. Consequently, throughput of an apparatus decreases. A temperature control mechanism which can control temperature of the sample is installed inside a mini-environment device. The sample temperature control mechanism controls the temperature of the sample inside the mini-environment device so as to become a setting temperature which is set in view of a lowered temperature of the sample inside a load lock chamber.

14 Claims, 4 Drawing Sheets

(51) Int. Cl.
H01L 21/67 (2006.01)
H01J 37/28 (2006.01)

(52) U.S. Cl.
CPC ........... *H01J 37/28* (2013.01); *H01J 2237/18* (2013.01); *H01J 2237/2001* (2013.01); *H01J 2237/24592* (2013.01); *H01J 2237/28* (2013.01)

(58) Field of Classification Search
USPC .............................. 250/441.11, 453.11, 492.2
See application file for complete search history.

(56) References Cited

U.S. PATENT DOCUMENTS

| | | | | |
|---|---|---|---|---|
| 7,024,266 | B2* | 4/2006 | Edo | G03F 7/7075 |
| | | | | 700/112 |
| 7,129,485 | B2* | 10/2006 | Nakasuji | B82Y 10/00 |
| | | | | 250/310 |
| 7,193,682 | B2* | 3/2007 | Yonekawa | G03F 7/70525 |
| | | | | 250/492.2 |
| 9,070,728 | B2* | 6/2015 | Kobayashi | C23C 16/46 |
| 2005/0252455 | A1 | 11/2005 | Moriya et al. | |
| 2009/0029502 | A1* | 1/2009 | Choi | H01L 21/67236 |
| | | | | 438/57 |
| 2010/0111648 | A1* | 5/2010 | Tamura | H01L 21/67248 |
| | | | | 414/217 |
| 2011/0117492 | A1 | 5/2011 | Yamada et al. | |

FOREIGN PATENT DOCUMENTS

| | | |
|---|---|---|
| JP | 10-233423 A | 9/1998 |
| JP | 10-303092 A | 11/1998 |
| JP | 2001-76998 A | 3/2001 |
| JP | 2005-354025 A | 12/2005 |
| JP | 2006-147638 A | 6/2006 |
| JP | 2008-211196 A | 9/2008 |
| JP | 2011-13196 A | 1/2011 |
| JP | 2011-108731 A | 6/2011 |
| JP | 3169239 U | 6/2011 |
| JP | 2012-84574 A | 4/2012 |

* cited by examiner

APPARATUS AND METHOD FOR PROCESSING SAMPLE, AND CHARGED PARTICLE RADIATION APPARATUS

TECHNICAL FIELD

The present invention relates to an apparatus for processing a sample, and for example, the present invention is applicable to an apparatus and a charged particle radiation apparatus which have a sample temperature control mechanism.

BACKGROUND ART

As semiconductor devices have recently been miniaturized, not only manufacturing apparatuses but also inspection or evaluation apparatuses need to be more precise corresponding to the miniaturization. A measurement apparatus for evaluating whether or not shapes and dimensions of a pattern formed on a semiconductor wafer are correct includes a scanning electron microscope provided with a length measurement function (hereinafter, referred to as a critical dimension-scanning electron microscope (CD-SEM) or a length measurement scanning electron microscope (SEM) in some cases).

As disclosed in PTL 1, the length measurement SEM is an apparatus which radiates an electron beam onto a wafer, performs image processing on a secondary electron signal obtained therefrom, and determines an edge of a pattern from a change in light density therein so as to derive dimensions.

In order to correspond to the miniaturization of the semiconductor devices, it is important to obtain a secondary electron image having much less noise by employing high observation magnification. Therefore, it is necessary to improve contrast by superimposing many secondary electron images on one another. A precise sub-nanometer order is required for a relative position change between an electron beam radiation position and a measurement target pattern on the wafer when an SEM image is acquired.

Here, if there is a temperature difference between the wafer serving as an observation target and a sample table of a sample stage on which the wafer is mounted in a vacuum chamber, the wafer is subjected to thermal expansion and contraction until the wafer is brought into a thermal equilibrium state. This thermal expansion and contraction causes the above-described relative position change, thereby degrading the SEM image.

In order to convey the wafer present in the atmospheric environment into the vacuum chamber, it is necessary to use a load lock chamber or the like. That is, after the wafer is conveyed to the load lock chamber at the atmospheric pressure, the inside of the load lock chamber is subjected to vacuum evacuation, and the wafer is conveyed onto the sample table inside the vacuum chamber. The vacuum evacuation of the load lock chamber is rapidly carried out. Accordingly, air temperature inside the load lock chamber is lowered due to adiabatic expansion. As a result, the wafer is cooled. If the wafer is conveyed to the sample table in this state, a temperature difference occurs between the wafer and the sample table.

In addition, even in a case where the wafer is observed immediately after the wafer is heated through a baking process in the previous step (wafer processing step), the temperature difference is likely to similarly occur between the wafer and the sample table.

In order to solve these problems, the related art has proposed a coping method of awaiting observation by setting a standby time from when the wafer is conveyed into the vacuum chamber until the wafer and the sample table are brought into thermal equilibrium. In addition, the coping method is configured so as to await the observation until the wafer is cooled down to room temperature when the wafer is heated in the previous step.

In addition, PTL 2 discloses a technique of providing a temperature control mechanism inside the load lock chamber.

CITATION LIST

Patent Literature

PTL 1: JP-A-9-166428
PTL 2: JP-A-10-303092

SUMMARY OF INVENTION

Technical Problem

The coping method of setting a standby time before observation as described above decreases the throughput of an apparatus. In addition, according to the technique of controlling the temperature inside the load lock chamber as disclosed in PTL 2, heat transfer performance is poor. Consequently, a long time is required until the temperature of a sample (wafer) becomes a desired temperature, thereby decreasing the throughput of the apparatus.

Other aspects and novel features will become apparent from the following description and the accompanying drawings.

Solution to Problem

As means for achieving aspects disclosed in the present application, a schematic configuration of representative means will be briefly described as follows.

That is, an apparatus for processing a sample includes a temperature control mechanism installed therein which can control the temperature of a sample inside a mini-environment device.

Advantageous Effects of Invention

According to the above-described apparatus for processing a sample, throughput of an apparatus can be considerably improved.

DESCRIPTION OF EMBODIMENTS

Hereinafter, an apparatus according to an embodiment will be described in detail with reference to the drawings.

Figure 5:
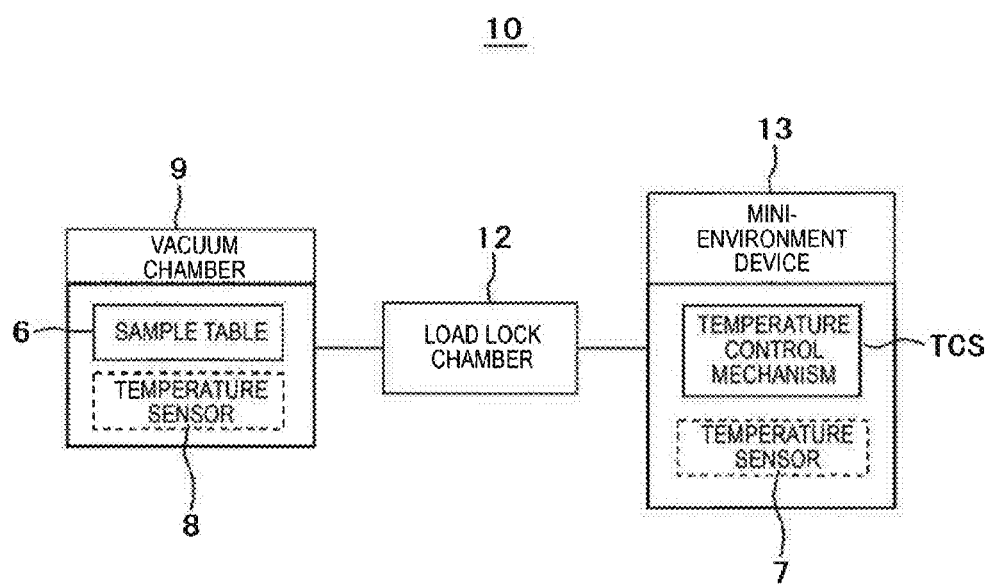
FIG. 5 is a configuration diagram of an apparatus according to the embodiment.

FIG. 5 is a configuration diagram of the apparatus according to the embodiment. An apparatus 10 has a vacuum chamber 9, a load lock chamber 12, and a mini-environment device 13. The apparatus 10 processes a sample on a sample table 6 inside the vacuum chamber 9. The load lock chamber 12 conveys the sample into the vacuum chamber 9 from the atmospheric environment. The mini-environment device 13 forms a small clean environment inside a clean room, and conveys the sample into the load lock chamber 12 from a conveyance-purpose sealed container. In addition, the mini-environment device 13 has a temperature control mechanism TCS for the sample inside the mini-environment device 13. In this manner, before the sample is observed, the sample is quickly controlled so as to have a desired temperature in the atmospheric environment which shows good heat transfer performance. Accordingly, throughput of the apparatus can be considerably improved by omitting a standby time inside the vacuum chamber 9.

Preferably, a first temperature sensor 8 for measuring the temperature of the sample table 6 is accommodated in the vacuum chamber 9. A second temperature sensor 7 for measuring the temperature of the sample inside the mini-environment device 13 is preferably accommodated in the mini-environment device 13. In addition, it is preferable to cause the sample temperature control mechanism TCS to measure the temperature of the sample table 6 so as to control the temperature of the sample inside the mini-environment device 13 to become a setting temperature which is set in view of a lowered temperature of the sample inside the load lock chamber 12. In this manner, prior to observation, various samples having different temperature are quickly controlled so as to have a desired temperature in the atmospheric environment which shows good heat transfer performance. Accordingly, throughput of the apparatus can be considerably improved by omitting a standby time inside the vacuum chamber 9.

EMBODIMENT

Hereinafter, according to an embodiment, a length measurement SEM which is a charged particle radiation apparatus will be described as an example. However, without being limited thereto, the embodiment is also applicable to electron microscopes, ion microscopes, defect inspection apparatuses, or the like. In addition, the apparatus according to the embodiment is also applicable to not only the charged particle radiation apparatuses but also manufacturing apparatuses, inspection apparatuses, and evaluation apparatuses for processing a sample in vacuum. Additionally, in addition to a wafer, the sample includes those which have a pattern formed on a substrate, such as photomasks, reticles, liquid crystal display devices, and the like.

Figure 1:
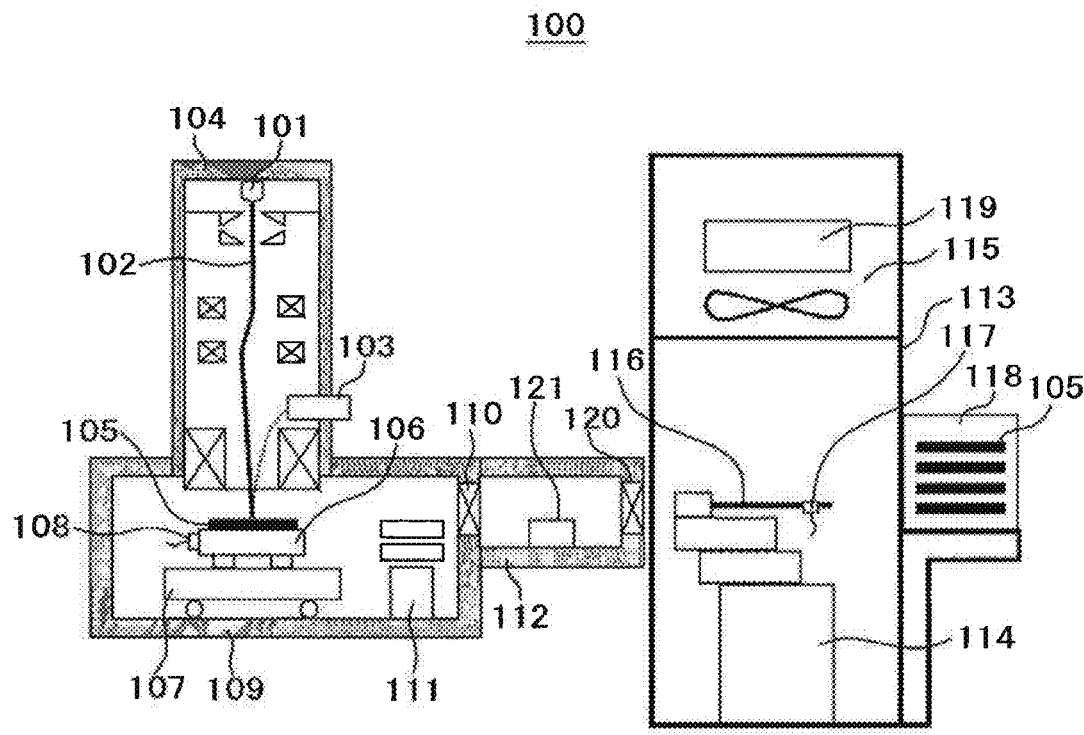
FIG. 1 is an overall configuration diagram of a length measurement SEM according to an embodiment.

FIG. 1 is an overall configuration diagram of the length measurement SEM according to the embodiment. A length measurement SEM 100 has a column 104, a vacuum chamber 109, a load lock chamber 112, and a mini-environment device 113. The vacuum chamber 109 accommodates a sample stage 106 for mounting a wafer (sample) 105 thereon. The load lock chamber 112 is configured to convey the wafer 105 into the vacuum chamber from the atmospheric environment. The mini-environment device 113 is configured to form a small clean environment inside a clean room.

Next, a conveyance route before the wafer 105 is observed will be described. The wafer 105 inside a front opening unified pod (FOUP) 118 is conveyed to a sample table 121 inside the load lock chamber 112 by an air conveyance robot 114 disposed inside the mini-environment device 113 after a gate valve 120 is opened. Thereafter, the gate valve 120 is closed so that the inside of the load lock chamber 112 is subjected to vacuum evacuation. Thereafter, a gate valve 110 installed between the vacuum chambers 109 is opened, and the wafer 105 is placed on the sample table 106 on a sample stage 107 by a vacuum conveyance robot 111.

During observation, the sample stage 107 is driven so as to move the wafer 105 to any desired position. Two-dimensional scanning is performed on the wafer 105 by using an electron beam 102 radiated from an electron gun 101 disposed inside the column 104. A signal (secondary electron signal, reflected electron signal, or the like) generated by the incident electron beam 102 is captured by a detector 103. Although not illustrated, an observation image is displayed on an image display device, based on the detected signal.

According to the above-described embodiment, in the present embodiment, the temperature of the sample table 106 can always be measured by installing a temperature sensor A (first temperature sensor) 108 in the sample table 106. In addition, the temperature of the wafer 105 which is an observation target can be measured by installing a temperature sensor B (second temperature sensor) 117 so as to come into contact with the wafer 105, in a conveyance arm 116 of the air conveyance robot 114 present inside the mini-environment device 113. Furthermore, a heat exchanger 119 is disposed in a fan filter unit (FFU) 115 installed so as to maintain a clean environment inside the mini-environment device 113. Accordingly, wind which is set to have any desired temperature can be blown therefrom (this is also referred to as sample temperature control mechanism).

Figure 6:
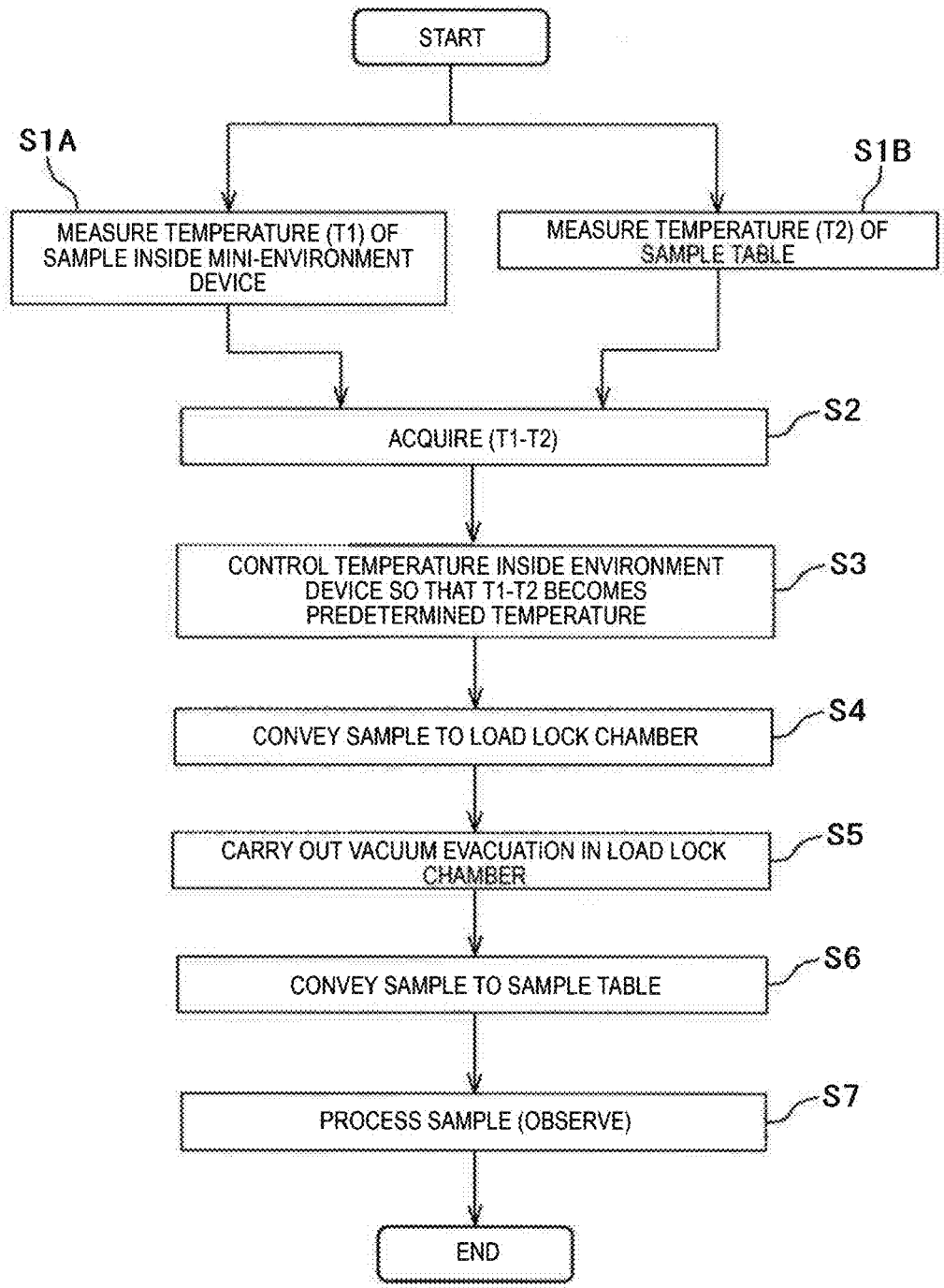
FIG. 6 is a flowchart illustrating an operation method of the length measurement SEM according to the embodiment.

FIG. 6 is a flowchart illustrating an operation of the length measurement SEM according to the embodiment. A temperature control method in the conveyance route until the wafer (sample) 105 is observed will be described with reference to FIG. 6. When the wafer 105 inside the FOUP 118 is held by the conveyance arm 116, a temperature (T1) of the wafer 105 is measured (Step S1A). Concurrently with this process, a temperature (T2) of the sample table 106 is also measured (Step S1B), and a temperature difference (T1-T2) between the wafer 105 and the sample table 106 is acquired (Step S2). A wind volume and a wind temperature of the FFU 115 are adjusted to control the temperature so that the temperature difference obtained here becomes a predetermined temperature difference (Step S3). The wafer 105 is conveyed into the load lock chamber 112 (Step S4). The subsequent processes until the observation are the same as those described above. That is, the load lock chamber 112 is subjected to the vacuum evacuation (Step S5), and the wafer 105 is conveyed to the sample table 106 (Step S6).

Although described above, the reason of controlling the temperature difference so as to become the predetermined temperature difference is that the wafer 105 is cooled due to adiabatic expansion when the inside of the load lock chamber 112 is subjected to the vacuum evacuation. For example, a method for obtaining the predetermined temperature difference includes the following three methods.

(1) Wafer Temperature Profile

The temperature of the wafer 105 to be cooled inside the load lock chamber 112 is measured in advance using a thermometer-incorporated wafer. The wafer has a function incorporated therein for storing the temperature in a timeseries manner. The temperature can be measured by examining stored content after the wafer is unloaded from the apparatus.

(2) Sample Table Temperature Change

The wafer 105 whose temperature is controlled to several patterns by the FFU 115 is placed on the sample table 106. Thereafter, the temperature sensor A108 observes a temperature change in the respective patterns, and the predetermined temperature difference is obtained from the pattern whose temperature change is minimized.

(3) Relative Position Change

After the wafer 105 whose temperature is controlled to several patterns by the FFU 115 is placed on the sample table 106, observation is performed by skipping the standby time until the wafer 105 and the sample table 106 are brought into thermal equilibrium so as to obtain a predetermined temperature difference from a pattern in which an amount of thermal expansion and contraction of the wafer 105 minimizes a relative position change.

According to any one of the above-described methods, an apparatus manufacturer can obtain a predetermined temperature difference, and then can register the predetermined temperature difference in an apparatus in advance before or when the apparatus is delivered to a user.

The above-described operation of the length measurement SEM according to the present embodiment is controlled by a control unit (not illustrated).

According to the above-described configurations and processes, prior to observation, various wafers 105 having different temperatures are quickly controlled so as to have desired temperatures in the atmospheric environment which shows good heat transfer performance. Accordingly, the throughput of the apparatus can be considerably improved by omitting the standby time inside the vacuum chamber 109. In addition, since there is no temperature difference between the wafer and the sample table, the relative position change is not caused by thermal expansion and contraction. Accordingly, it is possible to very precisely measure and inspect the pattern. Furthermore, unlike PTL 2, the temperature of the load lock chamber is not changed. Therefore, there is no problem that the temperature of the adjacent vacuum chamber may also be unintentionally changed.

Modification Example 1

Figure 2:
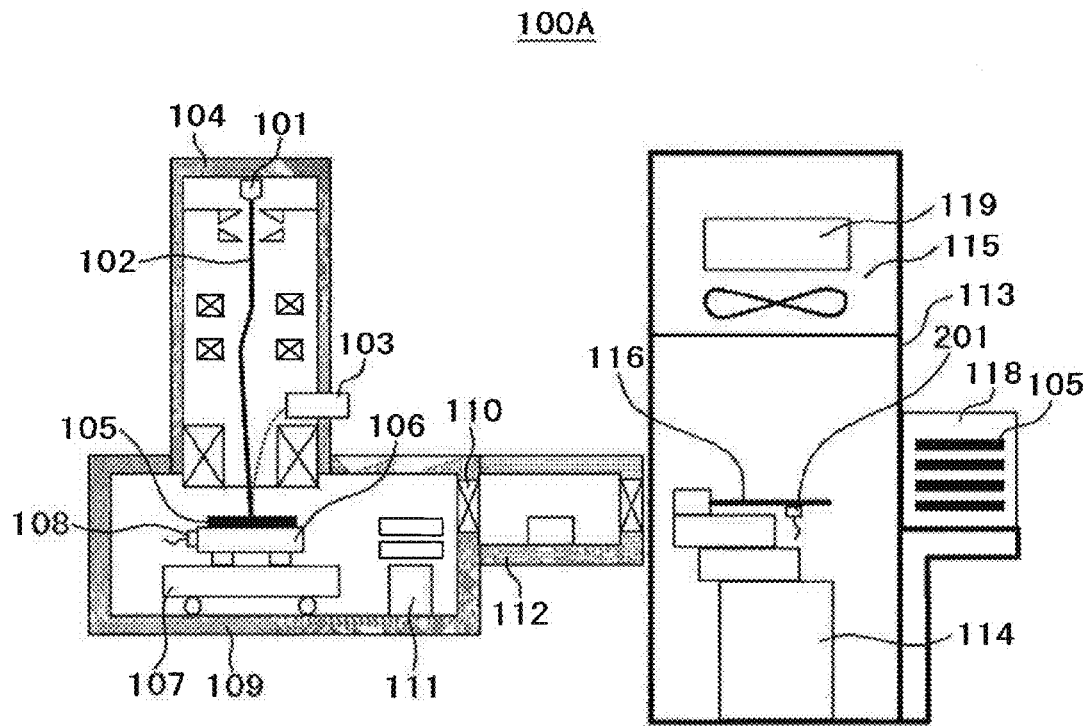
FIG. 2 is an overall configuration diagram of a length measurement SEM according to Modification Example 1.

FIG. 2 is an overall configuration diagram of a length measurement SEM according to Modification Example 1. A configuration is adopted in which the temperature of the wafer 105 inside the mini-environment device 113 is predicted by causing a temperature sensor C (second temperature sensor) 201 to measure the temperature of the conveyance arm 116. This configuration is advantageously adopted in terms of the contamination of the wafer 105, since the temperature sensor C201 does not come into contact with the wafer 105. Other configurations, processes, and advantageous effects of a length measurement SEM 100A are the same as those of the length measurement SEM 100 according to the embodiment in FIG. 1.

Modification Example 2

Figure 3:
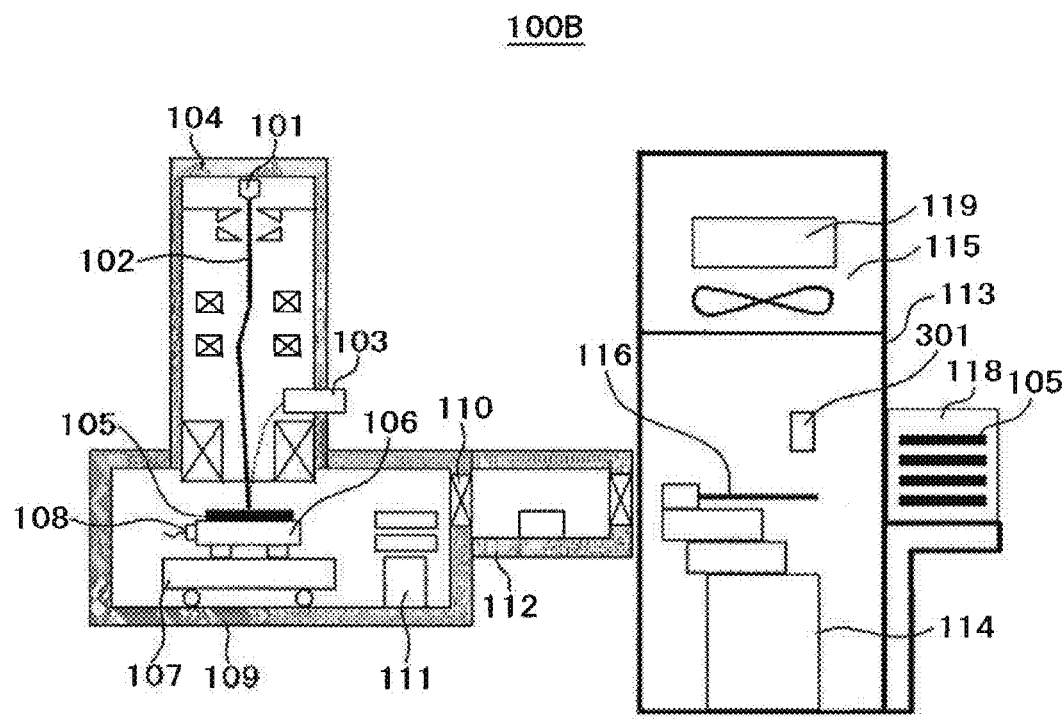
FIG. 3 is an overall configuration diagram of a length measurement SEM according to Modification Example 2.

FIG. 3 is an overall configuration diagram of a length measurement SEM according to Modification Example 2. A configuration is adopted in which the temperature of the wafer 105 inside the mini-environment device 113 is measured by a temperature sensor D (third temperature sensor) 301 of a non-contact type. Other configurations, processes, and advantageous effects of a length measurement SEM 100B are the same as those of the length measurement SEM 100 according to the embodiment in FIG. 1.

Modification Example 3

Figure 4:
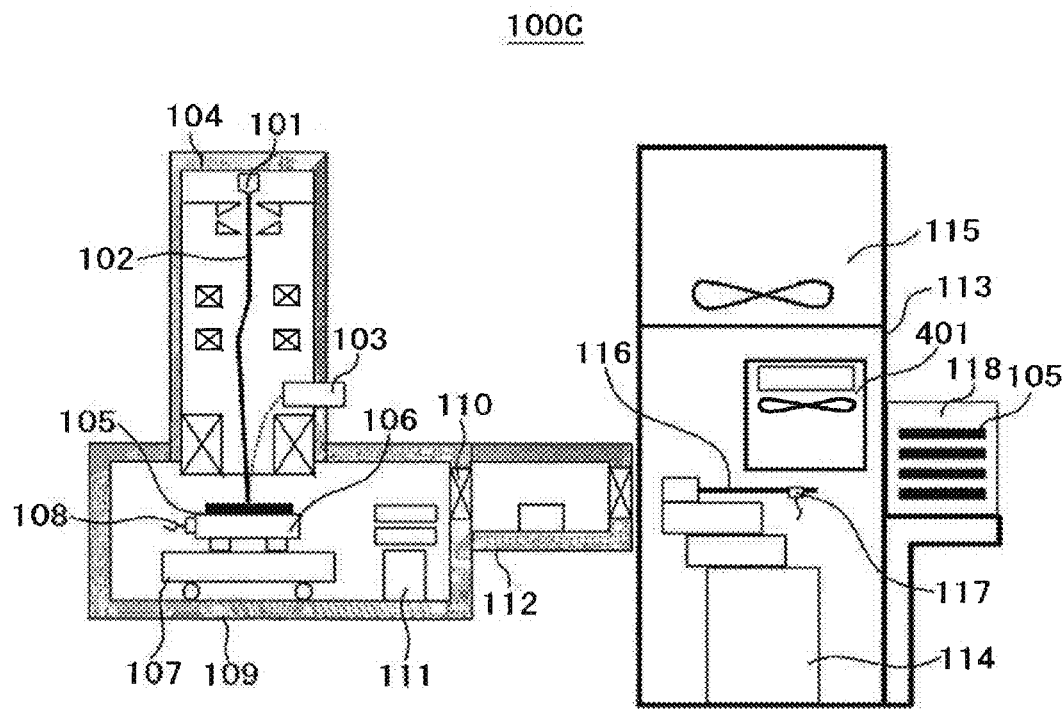
FIG. 4 is an overall configuration diagram of a length measurement SEM according to Modification Example 3.

FIG. 4 is an overall configuration diagram of a length measurement SEM according to Modification Example 3. A configuration is adopted in which the temperature of the wafer 105 is controlled inside a separate temperature control chamber 401 which is installed inside the mini-environment device 113. The heat exchanger 119 is not disposed inside the FFU 115, and the heat exchanger 119 is disposed inside the temperature control chamber (sample temperature control mechanism) 401 which has an FFU function. According to this configuration, the temperature can be controlled in a chamber which is smaller than the mini-environment device 113. Accordingly, the time required for controlling the wafer 105 so as to have a desired temperature is shortened. Other configurations, processes, and advantageous effects of a length measurement SEM 100C are the same as those of the length measurement SEM 100 according to the embodiment in FIG. 1. In addition, although not illustrated, the same advantageous effect may also be obtained if the respective configurations described in Modification Example 1 in FIG. 2 and Modification Example 2 in FIG. 3 are applied to the configuration in FIG. 4.

Hitherto, the present invention has been described in detail with reference to the embodiment and the modification examples. However, without being limited to the above-described embodiment and modification examples, the present invention can be modified in various ways, as a matter of course.

REFERENCE SIGNS LIST 6, 106 SAMPLE TABLE
7 SECOND TEMPERATURE SENSOR
8 FIRST TEMPERATURE SENSOR
9, 109 VACUUM CHAMBER
10 APPARATUS
12, 112 LOAD LOCK CHAMBER
13, 113 MINI-ENVIRONMENT DEVICE
100, 100A, 100B, 100C LENGTH MEASUREMENT SEM
101 ELECTRON GUN
102 ELECTRON BEAM
103 DETECTOR
104 COLUMN
105 WAFER (SAMPLE)
107 SAMPLE STAGE
108 TEMPERATURE SENSOR A
110 GATE VALVE
111 VACUUM CONVEYANCE ROBOT
114 AIR CONVEYANCE ROBOT
115 FFU
116 CONVEYANCE ARM
117 TEMPERATURE SENSOR B
118 FOUP
119 HEAT EXCHANGER
201 TEMPERATURE SENSOR C
301 TEMPERATURE SENSOR D
401 TEMPERATURE CONTROL CHAMBER

The invention claimed is:

1. A scanning electron microscope comprising:
a mini-environment device that includes a conveyance robot for carrying out a sample from a sample container in which the sample is stored, and that pressurizes space which includes the conveyance robot;
a load lock chamber that the sample is carried in to by the conveyance robot and that evacuates atmosphere around the sample;
a vacuum chamber that the sample is carried in to from the load lock chamber;
an electron beam column that irradiates an electron beam to the sample carried in to the vacuum chamber;
a sample stage that moves the sample to irradiate the electron beam at desired position of the sample;
a temperature control device that controls temperature of the pressurized space in the mini-environment device; and
a control unit that controls the temperature control device so that a temperature of the sample inside the mini-environment device rapidly becomes a setting temperature set in view of a lowered temperature of the sample inside the load lock chamber based on a predetermined temperature difference obtained in advance so as to omit standby time.

2. The charged particle radiation apparatus for processing a sample according to claim 1, further comprising:
a first temperature sensor that measures a temperature of a sample table on the sample stage; and
a second temperature sensor positioned relative to a conveyance arm of the conveyance robot that measures a temperature of the pressurized space in the mini-environment device,
wherein based on the temperature measured by the first temperature sensor and the temperature measured by the second temperature sensor, the temperature control device controls the temperature of the pressurized space in the mini-environment so as to become the setting temperature which is set in view of the lowered temperature of the sample inside the load lock chamber.

3. The charged particle radiation apparatus for processing a sample according to claim 2,
wherein the second temperature sensor is installed so as to come into contact with the conveyance arm of the conveyance robot which is arranged inside the mini-environment device.

4. The charged particle radiation apparatus for processing a sample according to claim 2,
wherein the second temperature sensor is installed so as to measure the conveyance arm of the conveyance robot which is arranged inside the mini-environment device.

5. The charged particle radiation apparatus for processing a sample according to claim 2,
wherein the second temperature sensor employs a temperature sensor using a non-contact measuring system.

6. The charged particle radiation apparatus for processing a sample according to claim 2,
wherein the mini-environment device further has a fan filter unit (FFU), and
wherein the temperature control device is configured so that a heat exchanger is installed inside the FFU.

7. The charged particle radiation apparatus for processing a sample according to claim 2,
wherein the temperature control device is configured so that a separate temperature control chamber is installed inside the mini-environment device.

8. The charged particle radiation apparatus for processing a sample according to claim 2,
wherein the setting temperature is calculated from a temperature difference which minimizes an amount of thermal expansion and contraction, by using an observation target image obtained by the sample whose temperature is controlled to several patterns by the temperature control device being conveyed to the sample table.

9. The charged particle radiation apparatus for processing a sample according to claim 2,
wherein the setting temperature is calculated from a temperature difference which minimizes a temperature change obtained by the sample whose temperature is controlled to several patterns by the temperature control device being conveyed to the sample table.

10. A method for processing a sample, comprising:
(a) a step of measuring a temperature of a pressurized space in a mini-environment device;
(b) a step of measuring a temperature of a sample table on a sample stage that moves the sample to irradiate the charged particle beam at desired position of the sample inside a vacuum chamber;
(c) a step of acquiring a temperature difference between the temperature of the pressurized space and the temperature of the sample table;
(d) a step of setting the temperature of the pressurized space in the mini-environment device so that the temperature difference rapidly becomes a predetermined temperature difference obtained in advance so as to omit standby time;
(e) a step of conveying the sample whose temperature is controlled to the sample table; and
(f) a step of processing the sample.

11. The method for processing a sample according to claim 10, further comprising:
(g) a step of conveying the sample to a load lock chamber; and
(h) a step of carrying out vacuum evacuation for the load lock chamber, between the steps (d) and (e).

12. A charged particle radiation apparatus comprising:
a mini-environment device that includes a conveyance robot for carrying out a sample from a sample container in which the sample is stored, and that pressurizes space which includes the conveyance robot;
a load lock chamber that the sample is carried in to by the conveyance robot and that evacuates atmosphere around the sample;
a vacuum chamber that includes a sample stage for moving the sample to any desired observation position;
a column that radiates an electron beam to the sample;
a temperature control device that controls temperature of pressurized space in the mini-environment device;
a temperature sensor that measures a temperature of a sample table on the sample stage, and a temperature of the sample inside the mini-environment device; and
a control unit that controls the temperature control device so that a temperature of the sample inside the mini-environment device rapidly becomes a setting temperature set in view of a lowered temperature of the sample inside the load lock chamber based on a predetermined temperature difference obtained in advance so as to omit standby time; and
wherein the temperature control device controls the temperature of the pressurized space in the mini-environment device so as to become the setting temperature which is set in view of the lowered temperature of the sample inside the load lock chamber.

13. The charged particle radiation apparatus according to claim 12,
wherein the setting temperature is calculated from a temperature difference which minimizes an amount of thermal expansion and contraction, by using an observation target image obtained by the sample whose temperature is controlled to several patterns by the temperature control device being conveyed to the sample table.

14. The charged particle radiation apparatus according to claim 12,
wherein the setting temperature is calculated from a temperature difference which minimizes a temperature change obtained by the sample whose temperature is controlled to several patterns by the temperature control device being conveyed to the sample table.

* * * * *